(12) United States Patent
Takahashi

(10) Patent No.: US 7,453,969 B2
(45) Date of Patent: Nov. 18, 2008

(54) PLL CIRCUIT AND PHASE CONTROL METHOD OF PLL CIRCUIT

(75) Inventor: Masayuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 697 days.

(21) Appl. No.: 11/166,217

(22) Filed: Jun. 27, 2005

(65) Prior Publication Data

US 2005/0286671 A1 Dec. 29, 2005

(30) Foreign Application Priority Data

Jun. 28, 2004 (JP) .............................. 2004-189581

(51) Int. Cl.
*H04L 7/00* (2006.01)
(52) U.S. Cl. ...................... 375/355; 375/371; 375/375; 375/376; 370/516; 327/147; 327/156
(58) Field of Classification Search ................ 375/354, 375/355, 371, 373, 375, 376; 370/503, 516; 327/147, 150, 156, 159
See application file for complete search history.

(56) References Cited

U.S. PATENT DOCUMENTS

| 4,975,634 | A | | 12/1990 | Shohet | |
|---|---|---|---|---|---|
| 5,638,409 | A | * | 6/1997 | Awata et al. ................ | 375/355 |
| 5,991,350 | A | | 11/1999 | Yamamoto | |
| 6,337,650 | B1 | * | 1/2002 | Mitsutani .................... | 341/155 |
| 6,441,601 | B1 | | 8/2002 | Clark et al. | |
| 6,934,869 | B1 | * | 8/2005 | Bhoja et al. ................. | 713/500 |
| 7,298,916 | B2 | * | 11/2007 | Miyamoto .................. | 382/254 |

FOREIGN PATENT DOCUMENTS

JP 2000-244472 A 9/2000

* cited by examiner

*Primary Examiner*—Dac V Ha
(74) *Attorney, Agent, or Firm*—Sughrue Mion, PLLC

(57) ABSTRACT

A PLL circuit having a phase build-out function and a phase control method of the PLL circuit, in which a phase build-out detector monitors the input phase of a PLL device and detects a transient wander component and a cycle wander component at the same time. When only the transient wander component is automatically detected, a phase build-out actuator resets a phase detector, a digital amp-1 and a digital filter to restructure an output phase as before an input phase change. As to the cycle wander component detected at the same time, no phase restructuring is carried out.

10 Claims, 8 Drawing Sheets

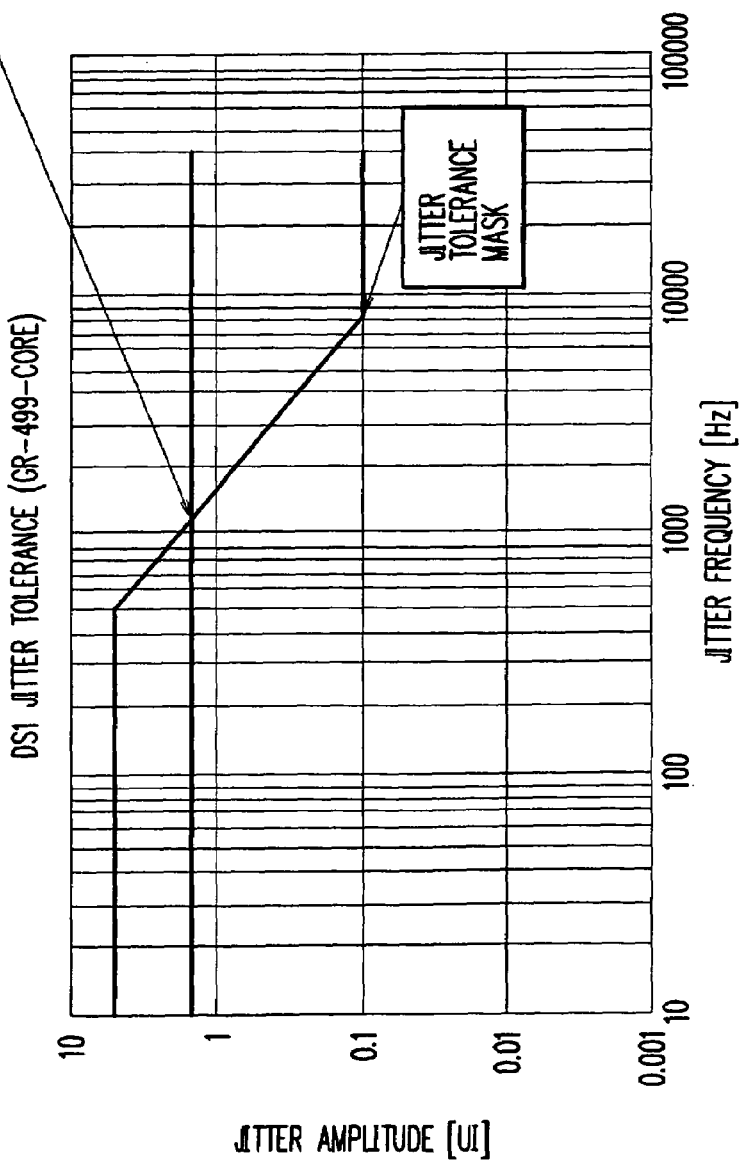
F I G. 7

PLL CIRCUIT AND PHASE CONTROL METHOD OF PLL CIRCUIT

BACKGROUND OF THE INVENTION

1. Field of the Invention

The present invention relates to a PLL (phase-locked loop) circuit and a phase control method of the PLL circuit, and more particularly to a PLL circuit having a phase build-out function of Stratum 3E clocks recommended by Telcordia GR-1244-CORE and a phase control method of the PLL circuit.

2. Background of the Related Art

The detailed specifications and functions of Stratum 3E clocks are recommended by Telcordia GR-1244-CORE. A phase build-out function is included in such functions. When a PLL circuit is designed according to the specifications in compliance with the Telcordia, two problems occur concerning restructuring of an output phase due to input phase noises.

First, since a transient wander generated within an interval time cannot be detected, restructuring of an output phase, which is to be essentially carried out, is not conducted. Second, when a cycle wander generated periodically is sometimes detected, wrong restructuring of the output phase is carried out. These two problems will be described in detail.

First, according to Telcordia GR-1244-CORE, the interval time of the phase build-out function is defined as 100 ms. Hence, as shown in FIG. 1, when a transient wander as an input phase noise is input, a maximum phase difference Y(ns) cannot be sometimes accurately detected. This is why the transient wander is inspected at that interval time and a momentary phase shift beyond twice the period (frequency of 5 Hz) of 100 ms cannot be detected. In order to detect a phase shift as momentarily as possible, one detecting method has proposed, as shown in FIG. 2. In FIG. 2, by changing interval time every sampling time, areas of up to a half frequency of the sampling time can be detected. However, when a transient wander synchronized with the interval time is generated, no detection can be occasionally performed.

Further, a cycle wander as an input phase noise is detected at the same time. As to the cycle wander, restructuring of the output phase should not be implemented. It is not easy that only the phase shift generated at the sampling time, as described above, is detected to determine either of the cycle wander and the transient wander.

In a conventional technique, as disclosed in Japanese Patent Application Laid-Open No. 2000-244472, a frame phase synchronous circuit for reducing an abrupt change of an output phase to a minimum is proposed. In this case, a plurality of sections for a phase difference between an input frame and an output frame are set and different voltages for controlling a VCO (voltage-controlled oscillator) depending on the phase difference are supplied. However, this device cannot solve the above-described two problems.

SUMMARY OF THE INVENTION

It is therefore an object of the present invention to provide a phase-locked loop circuit in view of the aforementioned problems of the prior art, which is capable of automatically detecting only a transient wander component and restructuring an output phase to a previous phase as before an input phase has changed.

It is another object of the present invention to provide a phase control method of a phase-locked loop circuit which is capable of automatically detecting only a transient wander component and restructuring an output phase to a previous phase as before an input phase has changed.

In accordance with one aspect of the present invention, there is provided a phase control method of a phase-locked loop circuit having a phase build-out function, comprising: a storing step for storing phase data obtained by sampling within monitoring interval time of an input phase into a memory; a calculating step for calculating a maximum phase amplitude value within the interval time from the phase data sampled; and a first comparing step for comparing the maximum phase amplitude value with a transient wander threshold value set for detecting a transient wander.

A phase control method of a phase-locked loop circuit further comprises a second comparing step for comparing the maximum phase amplitude value with a cycle wander threshold value set for detecting a cycle wander.

In a phase control method of a phase-locked loop circuit, the fact that results of the second comparing step sequentially coincide is evaluated.

A phase control method of a phase-locked loop circuit further comprises an optimizing step for optimizing a sampling frequency and a capacity of the memory on the basis of the transient wander threshold value.

In accordance with another aspect of the present invention, there is provided a phase-locked loop circuit having a phase build-out function, comprising: storing means for storing phase data obtained by sampling within monitoring interval time of an input phase into a memory; calculating means for calculating a maximum phase amplitude value within the interval time from the phase data sampled; and transient wander detecting means for comparing the maximum phase amplitude value with a transient wander threshold value set to detect a transient wander.

A phase-locked loop circuit further comprises cycle wander detecting means for comparing the maximum phase amplitude value with a cycle wander threshold value set to detect a cycle wander.

A phase-locked loop circuit further comprises control means for optimizing a sampling frequency and a capacity of the memory on the basis of the transient wander threshold value.

According to the present invention, by using a dual port memory, a phase jump such as a transient wander within interval time can be exactly detected and an output phase can be always maintained to be stable. Further, a cycle wander component periodically generated can be precisely detected to prevent an erroneous restructuring control of the output phase. Furthermore, by comparing a user-set threshold value with a jitter tolerance function, optimum memory sampling frequency and memory capacity can be determined to improve a performance of an entire circuit.

BRIEF DESCRIPTION OF THE DRAWINGS

The objects, features and advantages of the present invention will become more apparent from the consideration of the following detailed description, taken in conjunction with the accompanying drawings, in which:

FIG. 7 is a graphical representation showing relationship between jitter frequency and jitter amplitude concerning jitter tolerance according to one embodiment of the present invention.

DESCRIPTION OF THE PREFERRED EMBODIMENTS

The present invention will now be described in detail with reference to its preferred embodiments in connection with FIG. 3 to FIG. 8.

Figure 1:
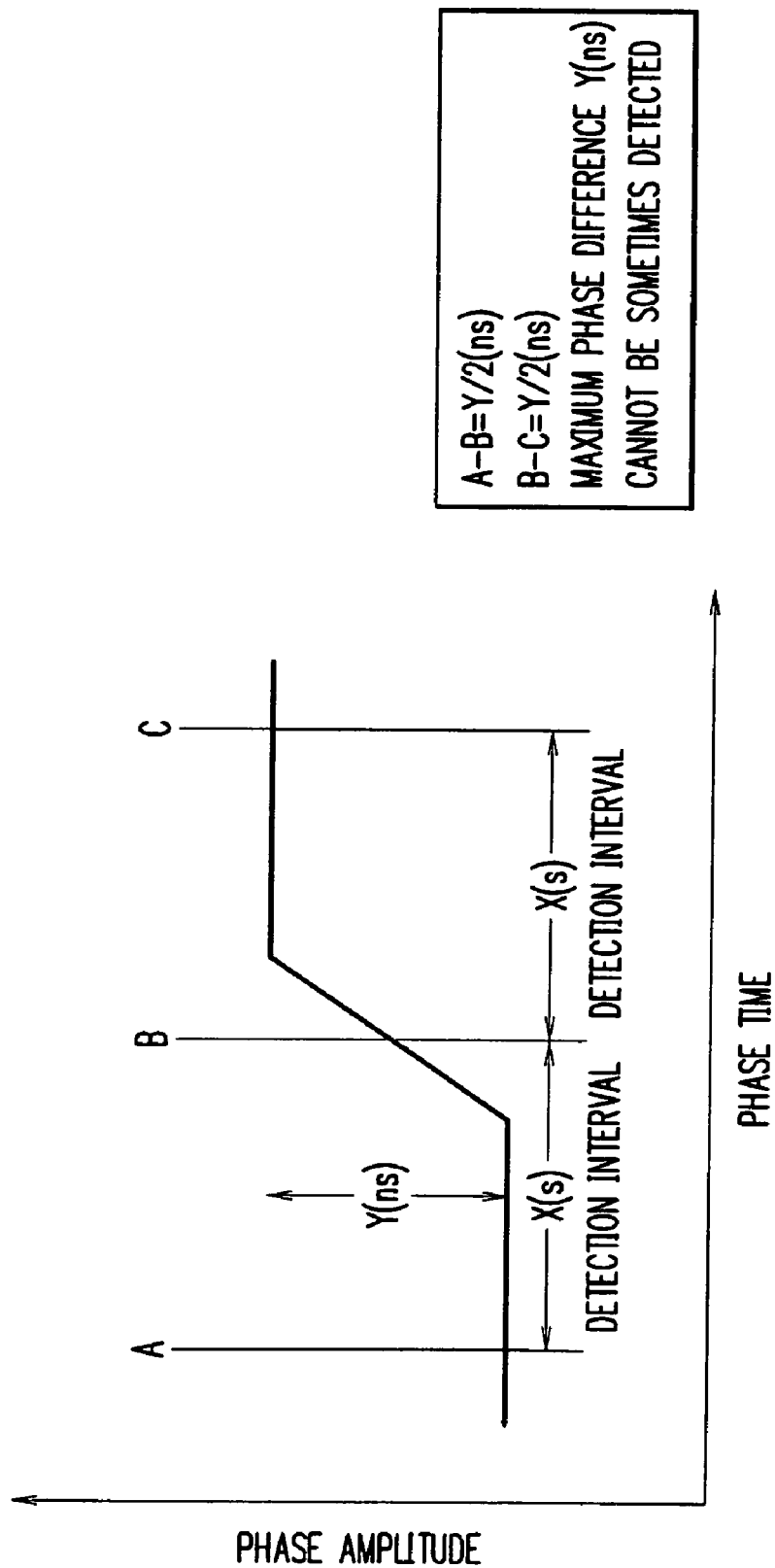
FIG. 1 is a graphical representation showing the relationship between phase amplitude and phase time for detecting a transient wander during interval time in a conventional method.
Figure 2:
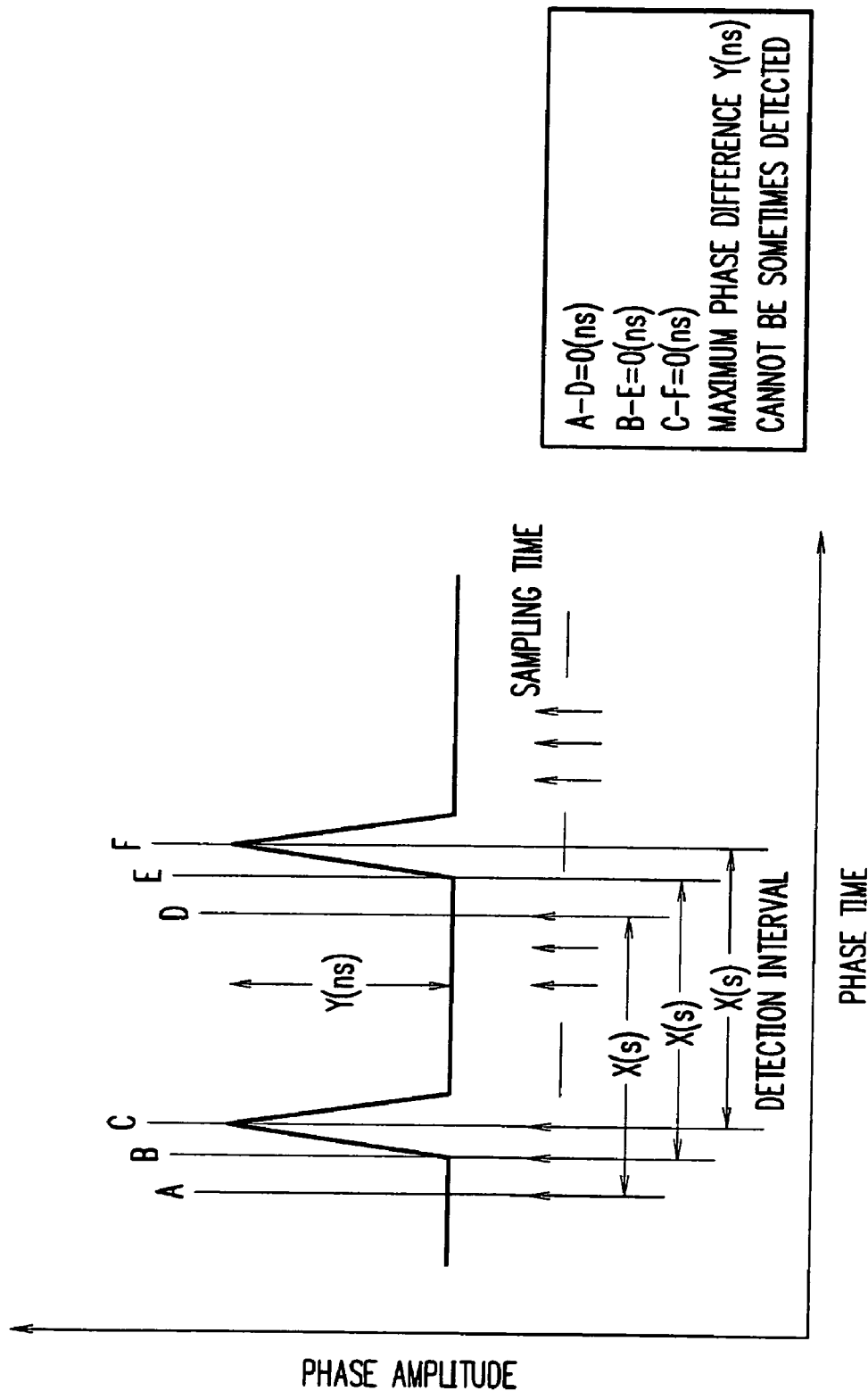
FIG. 2 is a graphical representation showing relationship between phase amplitude and phase time for detecting a transient wander during interval time in a conventional method.
Figure 3:
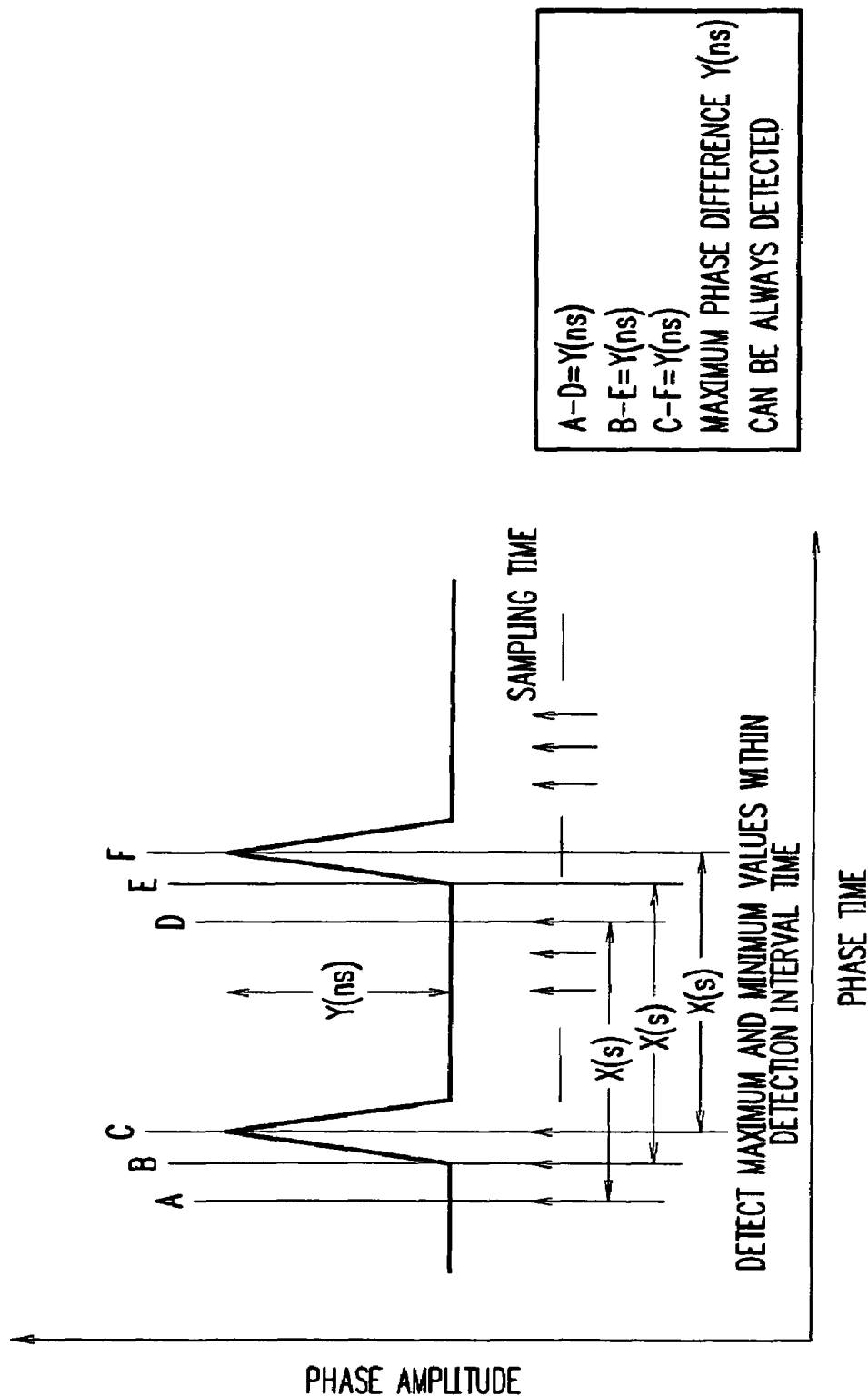
FIG. 3 is a graphical representation showing relationship between phase amplitude and phase time for detecting a transient wander during interval time according to one embodiment of the present invention.

In FIG. 3, there is shown relationship between phase amplitude and phase time for detecting a transient wander during interval time according to one embodiment of the present invention. As shown in FIG. 3, according to the present invention, all phase data within the interval time is stored in a memory and all phase data is then read out of the memory in a period until the next sampling. The maximum and minimum values of all the readout phase data are detected and a difference between the maximum and minimum values is discriminated whether to be larger or smaller than a specified threshold value to exactly detect a phase jump such as a transient wander and a cycle wander within the interval time. In this way, by contriving writing and reading periods, the phase jump such as the transient wander and the cycle wander within 100 ms can be detected.

At the same time, a periodic cycle wander component is detected as well. In the present method, a specified inner threshold value for the cycle wander is set and, when the detected value is beyond the threshold value in a certain time, the detected value is regarded not as a transient wander component but as a periodic phase component to avoid erroneous restructuring of an output phase.

Figure 4:
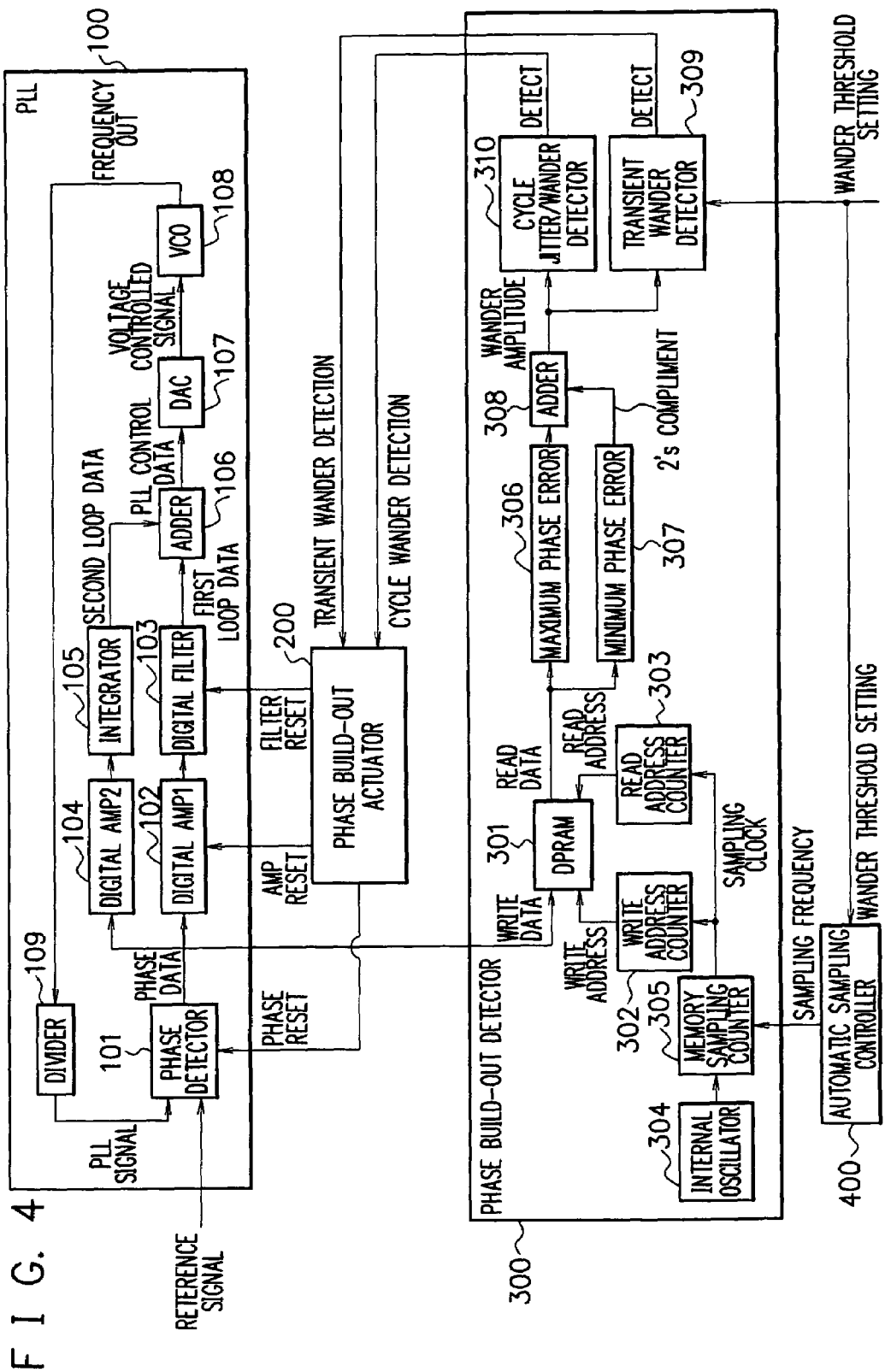
FIG. 4 is a schematic block diagram of a phase-locked loop circuit according to one embodiment of the present invention.

In FIG. 4, there is shown a PLL (phase-locked loop) circuit for realizing the present method according to one embodiment of the present invention.

The PLL circuit comprises a PLL device 100 for carrying out PLL processing, a phase build-out actuator 200 for restructuring an output phase on the basis of transient wander information and cycle wander information, a phase build-out detector 300 for detecting a transient wander and a cycle wander of an input signal, and an automatic sampling controller 400 for optimizing a memory capacity for the wander detections.

The PLL device 100 having a general full secondary digital PLL configuration includes a phase detector 101 for detecting a phase difference between the input signal and a VCO-reproduced signal to output a phase signal, digital amp-1 102 for performing amplification processing of a first loop, a digital filter 103 for removing phase noises of the first loop to output a first loop signal, digital amp-2 104 for performing an amplification processing of a second loop, an integrator 105 for implementing an integration processing of the second loop to output a second loop signal, an adder 106 for adding the first loop signal and the second loop signal to output a PLL control signal, a DAC (digital-to-analog converter) 107 for converting digital signals sent from the adder 106 into analog signals to output a voltage controlled signal, a VCO (voltage-controlled oscillator) 108 for changing an output frequency on the basis of the analog signal fed from the DAC 107, and a divider 109 for diving an output signal of the VCO 108 to output a reproduced PLL signal to the phase detector 101.

The phase build-out actuator 200 resets the phase detector 101, the digital amp-1 102 and the digital filter 103 of the PLL device 100.

The phase build-out detector 300 includes a DPRAM (dual port memory) 301 for storing input phase information, a write address counter 302 for producing write addresses of the DPRAM 301, a read address counter 303 for producing read addresses of the DPRAM 301, an internal oscillator 304 as an oscillator for producing each address, a memory sampling counter 305 as a counter for producing writing and reading periods of each address to output a sampling signal to the write address counter 302 and the read address counter 303, a maximum phase error 306 for calculating a maximum value of an input phase, a minimum phase error 307 for calculating a minimum value of the input phase, an adder 308 for detecting a difference between the maximum and minimum values of the input phase as a maximum phase difference, a transient wander detector 309 for detecting a transient wander component from an output signal of the adder 308 to output a transient wander detection to the phase build-out actuator 200, and a cycle jitter/wander detector 310 for detecting a cycle jitter/wander component from the output signal of the adder 308 to output a cycle jitter/wander detection to the phase build-out actuator 200.

The automatic sampling controller 400 automatically determines a sampling frequency of input phase data using a transient wander threshold value set by a user and optimizes the capacity of the memory for storing the input phase data.

In this embodiment, as described above, in order to determine the kinds of the input phase noises, the phase build-out detector 300 is provided with the transient wander detector 309 and the cycle jitter/wander detector 310 to achieve the expected restructuring processing of the output phase. Furthermore, the input phase data can be stored into the memory at an arbitrary sampling time and the difference between the maximum and minimum values within an arbitrary interval time is detected as the maximum phase difference. As a result, the transient wander between the intervals can be precisely detected without fail.

An operation of the PLL circuit shown in FIG. 4 will now be described in detail.

For realizing the Stratum 3E clocks recommended by the Telcordia, first, a basic PLL circuit is required. In FIG. 4, the PLL device 100 is shown as a block of a general full secondary digital PLL circuit for realizing the Stratum 3E clocks. Since this block is out of claims attached herewith, its detailed description can be unnecessary for brevity and hence its basic operation will be described.

The PLL device 100 reproduces a clean signal in synchronization with an input reference signal. First, the phase detector 101 detects a phase difference between an input signal and a reproduced signal obtained by frequency-dividing the output signal of the VCO 108 to output a phase signal. The phase signal is processed in two loops. That is, the first loop amplification processing and the noise filtering processing are implemented by the digital amp-1 102 and the digital filter 103, respectively. In parallel, the second loop amplification processing and the integration processing are performed by the digital amp-2 104 and the integrator 105, respectively. In a full secondary PLL, a frequency control is conducted in a first loop and a phase control in a second loop. The adder 106 adds the first and second loop signals sent from the two loops. The addition result as a digital signal is converted into an analog signal by the DAC 107 and the VCO 108 reproduces a frequency using the analog signal as a control voltage. Although the description of the basic operation of the PLL device 100 is completed, now, when a phase jump occurs in an input signal, a phase jump component also appears in an output phase to generate a transient wander. The Telcordia requires including a phase build-out function for suppressing this transient wander.

An operation of the phase build-out detector 300 will now be described in detail. The phase build-out detector 300 is an input phase detector as a detection trigger for a phase build-out processing required by the Telcordia. An input phase is detected using a dual port memory (DPRAM) 301. The memory sampling counter 305 produces write addresses and read addresses on the basis of an output signal of the internal oscillator 304. The maximum phase error 306 and the minimum phase error 307 detect a maximum phase difference and a minimum phase difference, respectively, from the phase data read out of the dual port memory 301, and the adder 308 calculates the absolute values of respective phase data. The transient wander detector 309 and the cycle jitter/wander detector 310 detect the absolute values fed from the adder 308.

Figure 5:
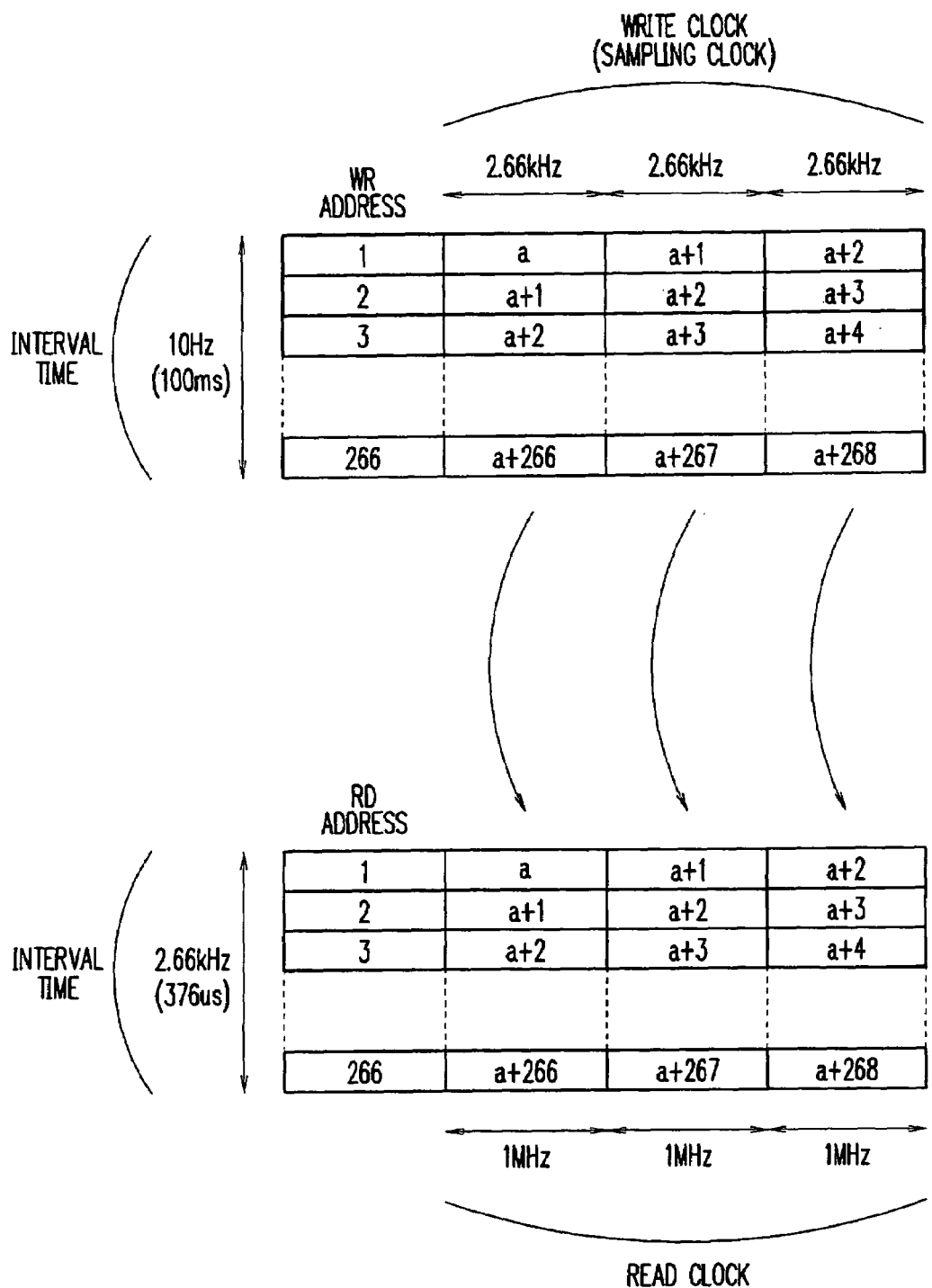
FIG. 5 is an imaginary view of a data storage according to one embodiment of the present invention.

An operation of writing and reading of the phase data into or out of the memory will be described in connection with FIG. 5. The Telcordial defines a monitoring interval time of an input phase as 100 ms. That is, the phase is monitored in 100 ms cycle. In this embodiment, in order to monitor a phase variation of less than 100 ms, a sampling time of the phase data is determined to a quicker period than the interval time. In this case, assuming that the sampling time is 2.66 kHz, the operation will be described. A data storing image is shown in FIG. 5. In a data storing in 100 ms, the phase data is stored into the memory in 2.66 kHz cycle, and after 100 ms passes, the phase data is updated every 2.66 kHz. As a result, 266 phase data in 100 ms is stored into the memory. In order to detect the maximum and minimum phase differences in 100 ms with high accuracy, 266 phase data must be read out of the memory until the next 2.66 kHz cycle, and hence a readout cycle is determined to approximately 2.66 kHz×266<<<1 MHz.

Figure 6:
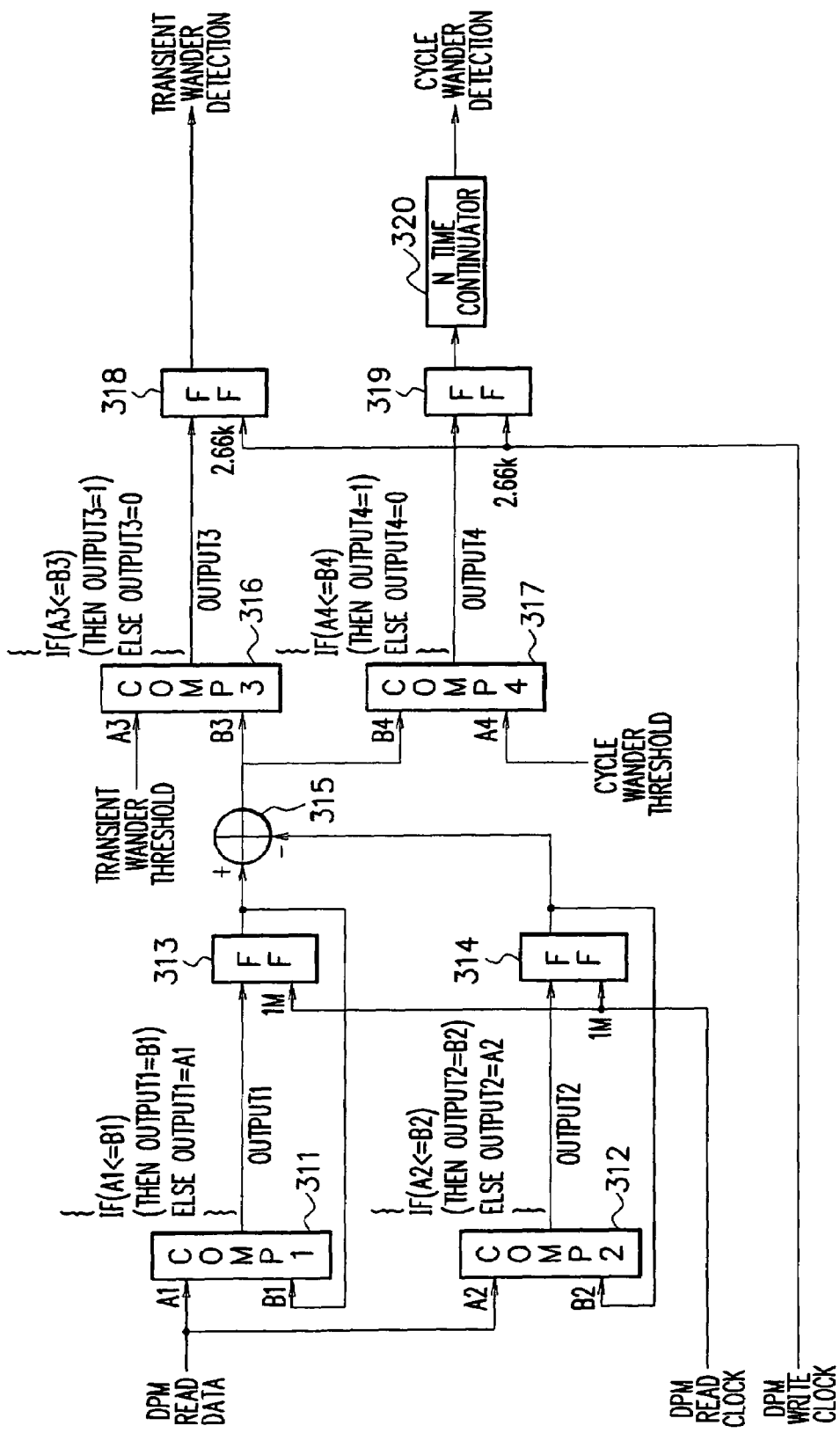
FIG. 6 is a schematic block diagram showing a phase difference detection according to one embodiment of the present invention.

A phase difference detection method in 100 ms will be described. In FIG. 6, there is shown a detailed phase difference detection block. This block is constituted of the maximum phase error 306, the minimum phase error 307, the adder 308, the transient wander detector 309 and the cycle jitter/wander detector 310 shown in FIG. 4. First, a maximum phase difference is detected, that is, the phase data read out of the memory is processed in COMP-1 311 and an FF 313, the two constituting a maximum phase difference detector. In the COMP-1 311, for instance, the input data A1 and B1 are compared with each other and always the larger data is stored in the FF 313. Similarly, a minimum phase difference is detected in COMP-2 312 and an FF 314, the two constituting a minimum phase difference detector. In the COMP-2 312, for instance, the input data A2 and B21 are compared with each other and always the smaller data is stored in the FF 314. The maximum and minimum phase data detected in the COMP-1 311 and the COMP-2 312 is added in an adder 315 and as a result, a maximum phase amplitude value can be obtained. The obtained maximum phase amplitude value is compared with a first phase amplitude threshold value specified by a user in COMP-3 316. When the maximum phase amplitude value is beyond the first phase amplitude threshold value, the COMP-3 316 outputs 1 to an FF 318. The result in the COMP-3 316 is renewed in the memory writing cycle and as a result, it is detected as a transient wander. Similarly, the maximum phase amplitude value obtained by the adder 315 is compared with a second phase amplitude threshold value set internally in COMP-4 317. When the maximum phase amplitude value is beyond the second phase amplitude threshold value, the COMP-4 317 outputs 1 to an FF 319. The result in the COMP-4 317 is also renewed in the memory writing cycle in the same manner as the COMP-3 316. The result of the COMP-4 317 is sent to an N time continuator 320 for detecting a coincidence of arbitrary continuous N times via the FF 319 to detect a cycle wander generated periodically.

An operation of the phase build-out actuator 200 to restructure an output phase on the basis of a transient wander detection signal and a cycle wander detection signal will be described. The phase build-out actuator 200 resets the phase detector 101, the digital amp-1 102 and the digital filter 103 in the PLL device 100 only when a transient wander is detected but a cycle wander is not detected. By resetting the phase detector 101, the digital amp-1 102 and the digital filter 103, the first loop data is cleared in the PLL device 100 and as a result, the adder 106 outputs only the second loop data integrated in the integrator 105. At Stratum 3E clocks, a factor of the second loop digital amp-2 104 comes up to zero without limit and hence, when the transient wander is generated, the output of the digital amp-2 104 gives no influence to the integrated value of the integrator 105. Accordingly, by resetting the phase detector 101, the digital amp-1 102 and the digital filter 103, the output phase can be restructured to the phase as before the transient wander is generated.

In this embodiment, the interval time can be fixed to 100 ms. Regarding the sampling time, as the frequency rises higher, the phase variation can be detected more momentarily. However, as the frequency rises higher, the memory capacity consumption becomes larger inversely to waste the memory. In this embodiment, optimization between the sampling frequency and the memory capacity is also considered as follows.

As to the transient wander, its frequency component is not defined by the Telcordia. However, concerning wander tolerance and jitter tolerance, their frequencies and amplitudes are defined by the Telcordia. Hence, regarding the wander and the jitter within their standards, it is undesirable to detect and process their phase build-out. Now, considering the frequency direction, since the interval time is 100 ms, areas less than 5 Hz can be detected. Therefore, the wander tolerance can be ignored and only the jitter tolerance is necessarily considered.

Next, considering the amplitude, according to the Telcordia the wander amplitude is equal to or more than 1 us. If a transient wander of at least 1 us is detected, it can be preferably recognized as the phase build-out and it is assumed that a threshold value is set to 1 us. When comparing with the jitter tolerance shown in FIG. 7, it is understood that amplitude of 1 us is in a band of approximately 1.1 kHz. Conversely, since the band equal to or more than 1.1 kHz is the amplitude equal to or less than 1 us, wrong detection cannot be conducted and hence it can be ignored. Hence, in order to exactly detect a band equal to or less than 1.1 kHz, the width of the frequency band must be doubled and the frequency should be equal to or more than 2.2 kHz. Actually, considering a margin, assuming that the frequency is 2.66 kHz, there are preferably 266 areas in the interval of 100 ms.

Figure 8:
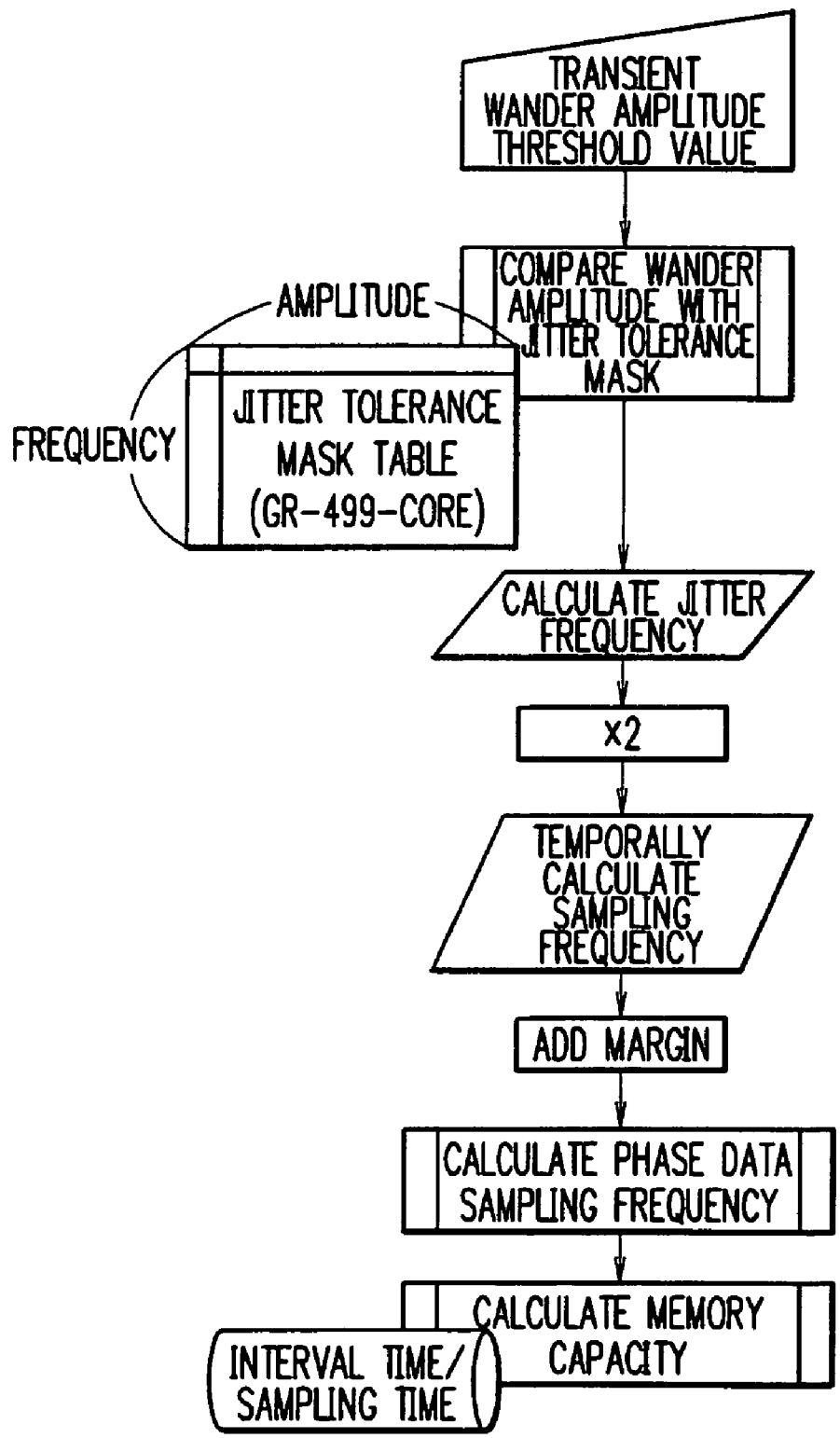
FIG. 8 is a flow diagram showing an operation of an automatic sampling controller shown in FIG. 4 for obtaining optimum sampling frequency and memory capacity.

In this way, optimum sampling frequency and memory capacity can be automatically determined through a flow in FIG. 8 processed in the automatic sampling controller 400.

The automatic sampling controller 400 compares transient wander amplitude with a function obtained from a jitter tolerance mask of DS1 signals defined by the Telcordia to determine an optimum memory sampling frequency and to optimize the memory capacity. As shown in FIG. 7, in the Telcordia, the relationship between jitter frequency and jitter amplitude in a synchronous network is simulated and a jitter tolerance mask is defined. Hence, intrinsically, the phase build-out detector 300 must not detect the maximum jitter defined by the Telcordia. For instance, assuming that a transient wander threshold value shown in FIG. 7 is 1 us, the maximum jitter frequency defined by the Telcordia is around 1.1 kHz. When a jitter having amplitude of 1 us at 1.1 kHz is input, this jitter must be exactly detected by the cycle jitter/wander detector 310 so as not to perform an erroneous phase build-out control. Since the jitter frequency is 1.1 kHz, the sampling must be necessarily carried out at twice the frequency, that is, 2.2 kHz according to a sampling theorem. In this embodiment, considering somewhat sufficient margin, when the sampling frequency is set to 2.66 kHz, 266 addresses as a memory capacity within the interval time of 100 ms can be readily calculated. In this manner, in a circuit having a shared memory, its memory capacity can be optimized and an entire performance can be improved.

As described above, in the present method, by using a dual port memory, a phase jump such as a transient wander within interval time can be exactly detected and more accurate phase components than the phase jump defined by the Telcordia can be detected. As a result, an output phase can be always maintained to be stable. Further, a cycle wander component periodically generated can be precisely detected to prevent an erroneous restructuring control of the output phase. Furthermore, by comparing a user-set threshold value with a jitter tolerance function defined by the Telcordia, optimum memory sampling frequency and memory capacity can be determined to improve a performance of an entire circuit.

While the present invention has been described with reference to the particular illustrative embodiments, it is not to be restricted by those embodiments but only by the appended claims. It is to be appreciated that those skilled in the art can change and modify the embodiments without departing from the scope and spirit of the present invention.

What is claimed is:

1. A phase control method of a phase-locked loop circuit having a phase build-out function, comprising:
    a storing step for storing phase data obtained by sampling within monitoring interval time of an input phase into a memory;
    a calculating step for calculating a maximum phase amplitude value within the interval time from the phase data sampled; and
    a first comparing step for comparing the maximum phase amplitude value with a transient wander threshold value set for detecting a transient wander.

2. A phase control method of a phase-locked loop circuit of claim 1, further comprising a second comparing step for comparing the maximum phase amplitude value with a cycle wander threshold value set for detecting a cycle wander.

3. A phase control method of a phase-locked loop circuit of claim 2, wherein the fact that results of the second comparing step sequentially coincide is evaluated.

4. A phase control method of a phase-locked loop circuit of claim 3, further comprising an optimizing step for optimizing a sampling frequency and a capacity of the memory on the basis of the transient wander threshold value.

5. A phase control method of a phase-locked loop circuit of claim 2, further comprising an optimizing step for optimizing a sampling frequency and a capacity of the memory on the basis of the transient wander threshold value.

6. A phase control method of a phase-locked loop circuit of claim 1, further comprising an optimizing step for optimizing a sampling frequency and a capacity of the memory on the basis of the transient wander threshold value.

7. A phase-locked loop circuit having a phase build-out function, comprising:
    storing means for storing phase data obtained by sampling within monitoring interval time of an input phase into a memory;
    calculating means for calculating a maximum phase amplitude value within the interval time from the phase data sampled; and
    transient wander detecting means for comparing the maximum phase amplitude value with a transient wander threshold value set to detect a transient wander.

8. A phase-locked loop circuit of claim 7, further comprising cycle wander detecting means for comparing the maximum phase amplitude value with a cycle wander threshold value set to detect a cycle wander.

9. A phase-locked loop circuit of claim 8, further comprising control means for optimizing a sampling frequency and a capacity of the memory on the basis of the transient wander threshold value.

10. A phase-locked loop circuit of claim 7, further comprising control means for optimizing a sampling frequency and a capacity of the memory on the basis of the transient wander threshold value.

* * * * *